United States Patent [19]
Benz et al.

[11] Patent Number: 5,588,466
[45] Date of Patent: Dec. 31, 1996

[54] MAGNETOSTRICTIVE TRANSDUCER

[75] Inventors: Gerhard Benz, Boeblingen; Gottfried Flik, Leonberg; Christoph Treutler, Wannweil; Heinz Friedrich, Friolzheim, all of Germany

[73] Assignee: Robert Bosch GmbH, Stuttgart, Germany

[21] Appl. No.: 356,281

[22] PCT Filed: Jun. 8, 1993

[86] PCT No.: PCT/DE93/00489

§ 371 Date: Dec. 20, 1994

§ 102(e) Date: Dec. 20, 1994

[87] PCT Pub. No.: WO94/00695

PCT Pub. Date: Jan. 6, 1994

[30] Foreign Application Priority Data

Jun. 20, 1992 [DE] Germany ............... 42 20 226.4

[51] Int. Cl.⁶ ............... F16K 31/02; F15C 5/00
[52] U.S. Cl. .......... 137/831; 137/833; 251/129.06; 335/215
[58] Field of Search ................... 137/831, 833; 251/129.06; 335/215; 417/413.3

[56] References Cited

U.S. PATENT DOCUMENTS

| | | | |
|---|---|---|---|
| 3,174,716 | 3/1965 | Salter ........................ | 251/129.06 |
| 3,370,538 | 2/1968 | Hines et al. | |
| 3,638,153 | 1/1972 | Sparrow. | |
| 4,158,368 | 6/1979 | Clark ........................ | 335/215 X |
| 4,581,624 | 4/1986 | O'Connor ................ | 251/129.06 |
| 4,644,310 | 2/1987 | Anderson et al. ........ | 335/215 |
| 4,845,450 | 7/1989 | Porzid et al. ............. | 335/215 |
| 5,096,643 | 3/1992 | Kowanz et al. . | |
| 5,161,774 | 11/1992 | Engelsdorf et al. . | |
| 5,271,431 | 12/1993 | Mettner et al. . | |

FOREIGN PATENT DOCUMENTS

| | | |
|---|---|---|
| 161397 | 11/1985 | European Pat. Off. . |
| 401607 | 12/1990 | European Pat. Off. . |
| 3919876 | 12/1990 | Germany . |
| 4003619 | 8/1991 | Germany . |

OTHER PUBLICATIONS

Inoue, et al., Multilayered Magneto–Surface–Acoustic––Wave Devices Composed of Highly Magnetostrictive Amorphous Fe–B Films and Thin Insulating Interlayers, 2419 Japanese Journal of Applied Physics, Mar. 28, 1989, pp. 132–134.

Butler, Application Manual for the Design of Etrema Terfenol–D Magnetostrictive Transducers, Edge Technologies, Inc., 1988.

Sze, VLSI Technology, McGraw Hill International, pp. 347–367.

Primary Examiner—Gerald A. Michalsky
Attorney, Agent, or Firm—Kenyon & Kenyon

[57] ABSTRACT

A magnetostrictive transducer wherein a magnetostrictive layer is applied to a flexible element, for example, a flexible beam. The flexible element is deflected by an external magnetic field. The thin magnetostrictive layer consists of $Tb_{(1-x)}Dy_{(x)}Fe_2$.

17 Claims, 3 Drawing Sheets

5,588,466

MAGNETOSTRICTIVE TRANSDUCER

FIELD OF THE INVENTION

The invention relates to a magnetostrictive transducer.

BACKGROUND INFORMATION

A magnetostrictive transducer is described in the corporate literature of Edge Technologies, Inc. entitled "Application Manual for the Design of Extreme Terfenol Magnetostrictive Transducers," which features a coil traversed by current and a terbium-dysprosium-iron alloy rod arranged therein. Furthermore, a microvalve is described in German Patent Application No. 40 03 619, wherein a fluid jet can be directed into one of two outlet channels using a flexible plate arranged parallel to the incoming fluid jet. The elastic plate is thermomechanically driven. Furthermore, a microvalve is described in German Patent Application No. 39 19 876, wherein a sealing block suspended by piezoelectrically driven flexible plates can close an outlet. Deposition of thin metal layers from a metal vapor is described, for example, in a book by Sze, VLSI Technology, McGraw-Hill International, pp. 347–367.

SUMMARY OF THE INVENTION

The magnetostrictive transducer according to the present invention has the advantage over the prior art in that the thin layers are also suited as drivers for very small transducers. By using flexible elements, very large deflections can be achieved. Furthermore, with the thin magnetostrictive layers very high forces can be produced in relation to their size. Furthermore, it can be regarded as an advantage that the thin magnetostrictive layers need no additional lead-ins and thus can be used in places where electric lead-ins could represent a considerable problem. Furthermore, transducers with magnetostrictive thin layers can be operated at very high frequencies and have better dynamic characteristics than, for example, macroscopic rods.

The thin layers exhibit a high magnetostrictive effect, i.e., a large relative change in length when they are amorphous or have a monocrystalline structure. Such layers are also distinguished through low hysteresis of the magnetostrictive effect. Using structuring, the thin layers can be located at a point where high tensile or compression stresses must be produced in order to obtain long travel paths for the bending transducer. Thus, a plurality of miniaturized magnetostrictive transducers can be produced at the same time on a substrate board. By separating the thin layer into several individual, electrically insulated domains, eddy currents are suppressed in the thin layer and thus the dynamic characteristics of the magnetostrictive layer are improved. The bending elements can be shaped as flexible beams or membranes. By annealing or depositing in an external magnetic field, a magnetic preferred direction, the direction of the "light" magnetization, is obtained in the thin layers.

Even for low external magnetic fields of 500 Oersted, a high magnetostriction on the order of $10^{-4}$ is achieved when the magnetic field is applied to the preferred direction, i.e., parallel to the direction of light magnetization. Without special precautions this preferred direction is located mostly in the layer plane of amorphous specimens. By annealing in an external magnetic field or depositing in an external magnetic field, the achievable magnetostriction can be further increased, and also the preferred direction can be adjusted in an arbitrary manner. Thus, bending transducers with high deflections for low external fields can be constructed where the external field can be either perpendicular or parallel to the magnetostrictive thin layer.

By embedding the thin magnetostrictive layer in other thin layers made of a soft magnetic material, the external magnetic field is reinforced in the domain of the thin magnetostrictive layer, so that high forces can be obtained with weak external magnetic fields. Measures for reinforcing the magnetostrictive effect allow the use of especially simple coils for obtaining the magnetic field. For example, the coils can be made by thick layer technology. Such an attractive field of application for the magnetostrictive transducer is the use, for example, in valves, since in this case relatively high forces are required and it is difficult to introduce electric wiring in the valve. In this valve the outlet is closed by a bending transducer, so that pulverization of the medium leaving the valve can be supported by the vibration of the bending transducer. Particularly small valves can be made of, for example, silicon wafers, but metallic substrate boards, for example steel, nickel, or titanium, are also suited for making magnetostrictive transducers.

DETAILED DESCRIPTION

Figure 1:
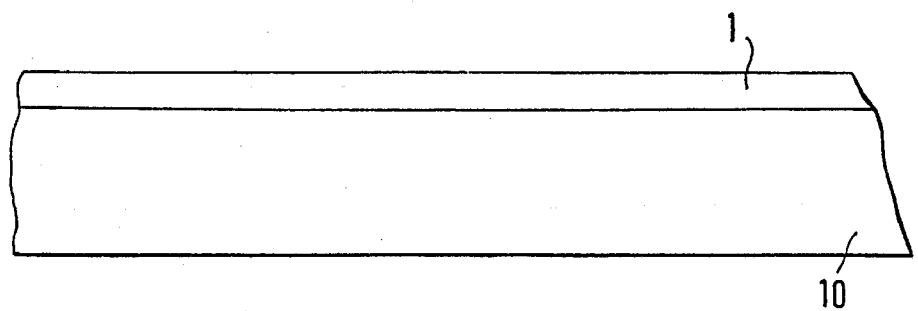
FIG. 1 shows a thin layer on a substrate.

In FIG. 1, a silicon wafer on which a thin magnetostrictive layer 1 is deposited is denoted with 10. Thin layer 1 composed of the elements terbium, dysposium and iron; the composition is given by the empirical formula $Tb_{(1-x)}Dy_{(x)}Fe_2$ with $0<x<1$. Here x is preferably on the order of $0.75\pm0.11$. The microstructure of the thin layer is preferably amorphous. Amorphous layers are considered layers that show no diffraction in a transmission electron microscope in the diffraction mode. Good magnetostrictive characteristics of thin layer 1 can also be achieved using nanocrystalline layers having a grain diameter smaller than 50 nanometers. In contrast with amorphous layers, in the case of coarse crystalline layers pronounced hysteresis characteristics are observed. Therefore, coarse crystalline layers are ill-suited for use with low external magnetic fields. Using well-known methods such as application of a photoresist, photolithography and subsequent etching, thin layer 1 can be constructed so that a structured thin magnetostrictive layer 2 is obtained, as shown, for example, in FIG. 2. Thin layer 1 is etched, for example, using a mixture of hydrochloric acid, nitric acid and water. Silicon wafer 10 is structured so that flexible beam 11, suspended from frame 12, is obtained. The silicon micromechanical processes required are well known to the person skilled in the art.

Figure 2:
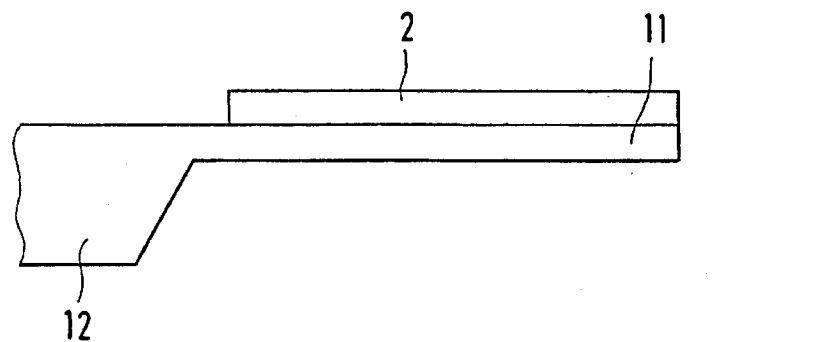
FIG. 2 shows a thin layer on a flexible plate.
Figure 3:
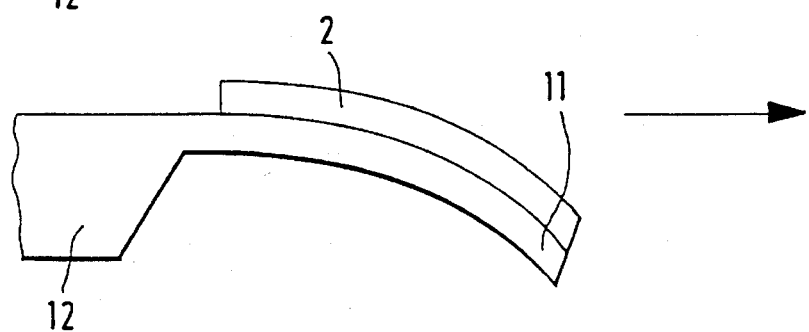
FIG. 3 shows a deflection of the flexible plate due to a parallel magnetic field.
Figure 4A:
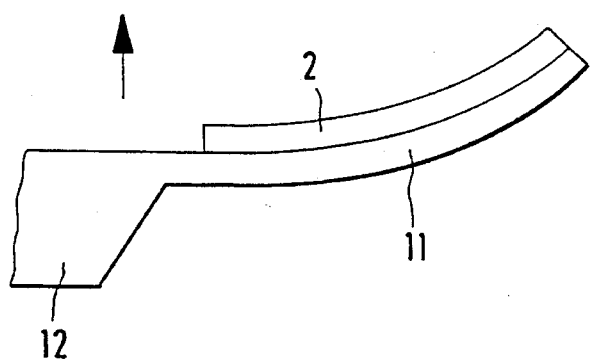
FIG. 4a shows a deflection of the flexible plate due to a perpendicular magnetic field.

FIGS. 3 and 4a show the effect of an external magnetic field on flexible beam 11 with magnetostrictive thin layer 2 applied as a function of the direction of the magnetic field. The initial situation, i.e., the position of flexible beam 11 without a magnetic field, corresponds to the position shown in FIG. 2. In FIG. 2 it was assumed that when thin layer 1 is deposited on wafer 10, no internal stress is produced in the bond consisting of magnetostrictive layer 1 and wafer 10. This, however, is difficult to achieve industrially when silicon wafers are used as substrates, since the thin magnetostrictive layer is usually deposited at high temperatures, and the thermal expansion coefficient of TbDyFe alloys is substantially higher than that of monocrystalline silicon. It is, however, possible to influence deposition so that stress-free metallic layers are obtained on the silicon wafers. In FIG. 2 it is assumed that no stress exists between thin magnetostrictive layer 2 and flexible beam 11. In order to reduce heat-induced internal stresses, the silicon substrate must be especially well cooled. In this case it is possible to influence the deposition so that almost stress-free TbDyFe layers are obtained on the silicon wafers. When using metallic substrates such as steel, titanium, or nickel, it is more advantageous that the thermal expansion coefficients be better matched to that of the TbDyFe layer.

FIG. 3 shows the effect of a magnetic field that is parallel to the length of flexible beam 11. A magnetostrictive material expands in the direction of the magnetic field. Since the magnetic field, as indicated by the arrow, is parallel to the initial position of flexible beam 11, thin layer 2 becomes longer and flexible beam 11 is deflected to the side on which there is no thin layer 2, in this case downwards. In the arrangement illustrated in FIG. 3, the dynamics of the bending transducer is only negligibly inhibited by eddy currents that may be produced in the layer. Eddy currents are produced basically in a single plane parallel to the magnetic field; however, the thicknesses used here, 1–20 μm are too small for eddy currents to be produced to any significant degree.

FIG. 4a shows the effect of a magnetic field oriented perpendicularly to the length of flexible beam 11 as indicated by the arrow. Magnetostrictive layer 2 expands in the direction of the magnetic field. This expansion alone, however, cannot cause flexible beam 11 to bend. Since in the first approximation the volume of magnetostrictive thin layer 2 is preserved, it contracts in the direction perpendicular to the magnetic field, i.e., parallel to flexible beam 11. Hence the shortening of thin layer 2 causes flexible beam 11 to be deflected to the side where thin layer 2 is located. Since, however, this is an indirect effect, the deflections that can thus be achieved are smaller than those in FIG. 3 for otherwise the same dimensions. For this orientation of the magnetic field, however, it is advantageous that coils that produce a magnetic field that is oriented perpendicularly to flexible beam 11 can usually be manufactured more easily and inexpensively than coils that produce a magnetic field parallel to flexible beam 11.

Figure 4B:
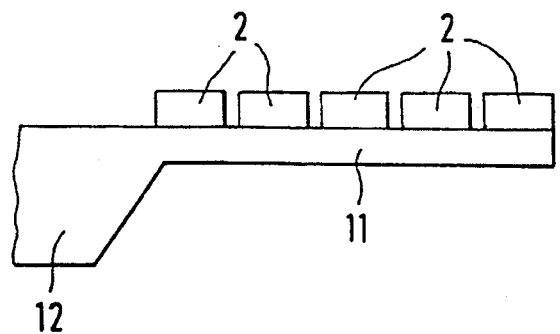
FIG. 4b shows an embodiment of the thin layer according to the present invention.

In the arrangement of FIG. 4a, eddy currents can be shown more easily than in FIG. 3. FIG. 4b therefore shows a structuring of magnetostrictive thin layer 2, which suppresses most eddy current formation. In order to interrupt the eddy current path, magnetostrictive layer 2 is photolithographically divided into electrically insulated areas. For high frequencies of the external magnetic field, eddy currents result in undesirable heating of the transducer and weakening of the magnetic field and thus prevent thin layer 2 from quickly reacting to the magnetic field.

The effects depending on the orientation of the magnetic field, described in FIGS. 3 and 4a, are obtained if the flexible beam has already been deflected due to internal stresses between flexible beam 11 and thin layer 2 in a state where there is no external magnetic field.

Figure 5:
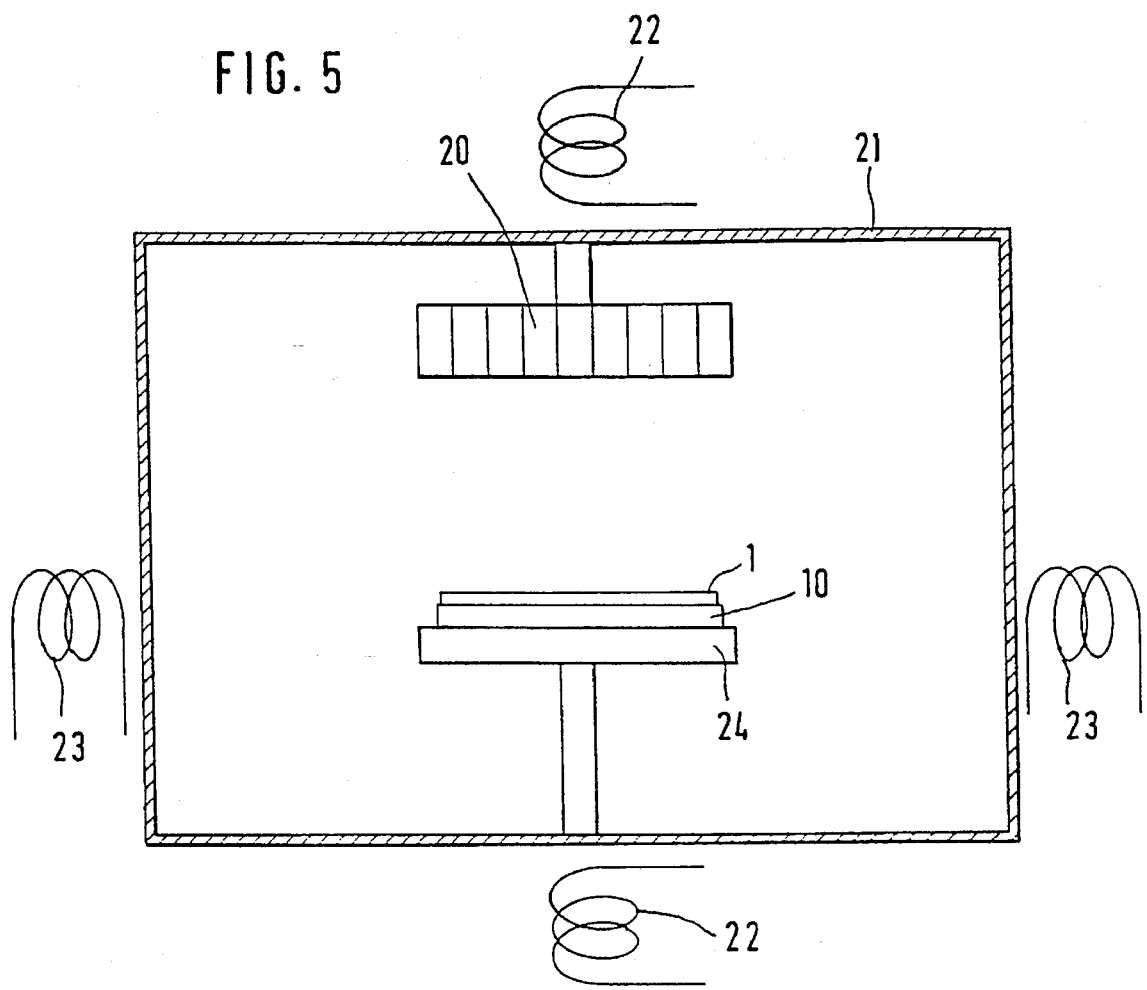
FIG. 5 shows a sputtering system for depositing the thin layer.

FIG. 5 describes the production of thin layer 1 on a wafer 10 in a sputtering system. In a vacuum chamber 21, an argon plasma is produced between a target 20 and wafer 10 and is directed onto target 20 so that metal atoms are knocked out of target 20. As a result the metal atoms are deposited on the surface of wafer 10. Care must be taken to keep the oxygen and water level in the argon atmosphere as low as possible in order to avoid oxidation of terbium and dysprosium. Target 20 is designed as a mosaic target, i.e., it consists of individual pieces of the three elements terbium, dysprosium and iron. The tiles are selected so that the desired composition of thin layer 1 is achieved. Alternatively, an alloy target can also be used. Wafer 10 is placed on a substrate holder, which can be cooled and heated. Furthermore, the substrate holder is rotatably mounted in order to improve the homogeneity of the layer composition. In addition, an electric voltage ("bias voltage") can be applied to the substrate holder, which can also influence the quality of deposition. Furthermore, coils 22 and 23 are provided, of which coil 22 produces a magnetic field that is perpendicular to the wafer and coil 23 produces a magnetic field that is parallel to the wafer surface.

With the help of coils 22, 23, both the intensity of achievable magnetostriction (referred to as saturation magnetostriction) and the direction of light magnetization can be influenced. When the external magnetic field needed for actuating a bending transducer is parallel to the direction of light magnetization, a high magnetostriction-induced length change is achieved even for a low external magnetic field. On the other hand, if the external magnetic field is perpendicular to the light magnetization, then relatively high magnetic fields, produced at a considerable cost, are needed in order to achieve a comparable magnetostrictive effect. Thus for high-performance and inexpensively produced bending transducers it is advantageous that the direction of the external magnetic field coincide with that of light magnetization.

For layer deposition without operating external magnetic coils 22 and 23 the direction of light magnetization is usually in the plane of the layer, i.e., parallel to the substrate surface. The preferred direction is produced in the layer plane by depositing the layer in the magnetic field of coil 23, but a considerably higher magnetostrictive effect is achieved for relatively lower external magnetic fields than when depositing without operating coil 23. By depositing the layer in the magnetic field of coil 22, the direction of light magnetization can be adjusted to be perpendicular to the layer surface. Thus a higher magnetostrictive effect is achieved for lower external magnetic fields oriented perpendicularly to the layer surface.

Another possibility consists of heating thin layer 1 using heater 24 and recooling it in an external magnetic field. In this case, however, temperatures of about 350° C. must not be exceeded, or else amorphous thin layer 1 is recrystallized, causing increased hysteresis.

Figure 6:
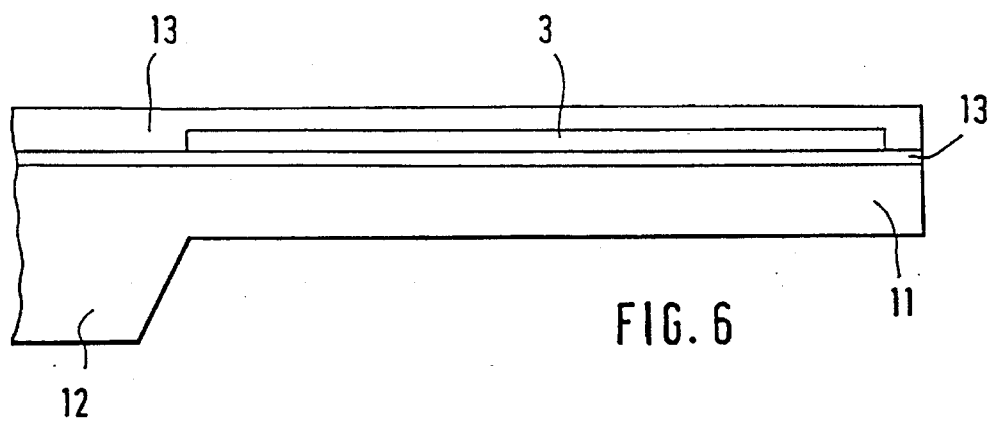
FIG. 6 shows a thin layer embedded in two soft magnetic layers.

FIG. 6 shows another advantageous embodiment of a flexible beam 11 suspended from frame 12 with a thin magnetostrictive layer 3. Thin magnetostrictive layer 3 is embedded in thin soft magnetic layers 13 with low hysteresis and high magnetic susceptibility such as of a FeNi alloy known under the commercial name of Permalloy. The external magnetic field is enhanced by the soft magnetic material of the thin layers 13. In this manner lower magnetic field intensities and simpler coils can be used for producing the magnetic field. Such a soft magnetic layer can also serve as a protective layer to prevent undesirable aging effects, e.g. via reaction with atmospheric oxygen. The use of other protective layers, e.g. made of silicon nitride, glass, nickel-chrome alloy, titanium nitrate or titanium, is also possible.

Figure 7:
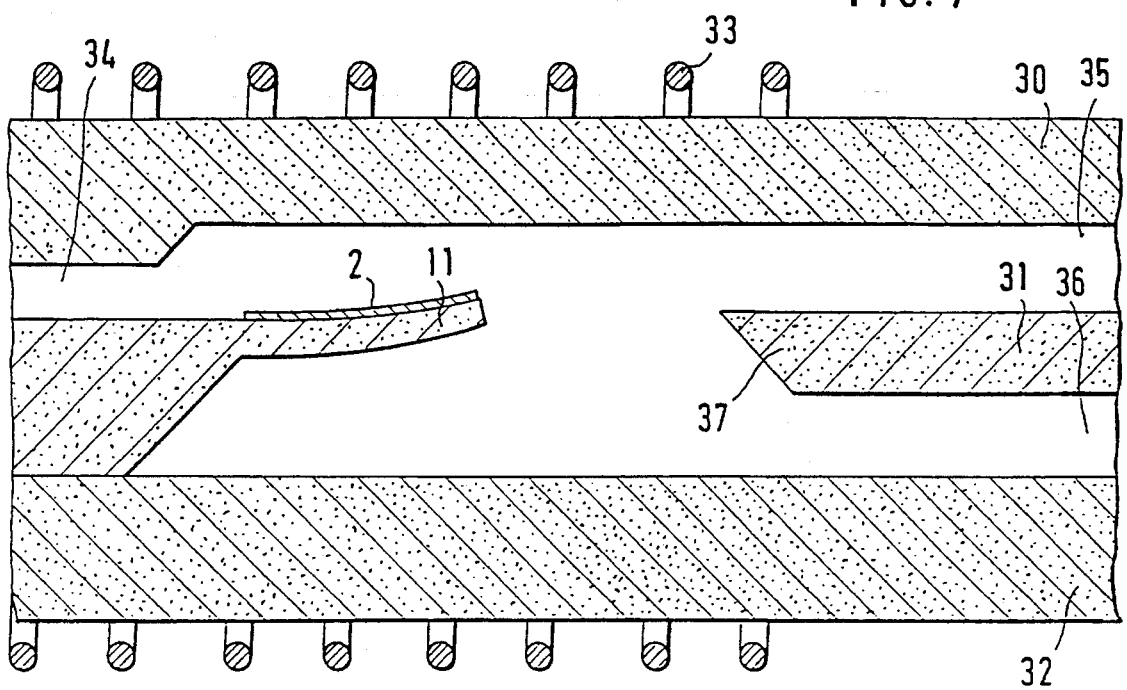
FIG. 7 shows a first example of an embodiment of a magnetostrictive valve according to the present invention.

FIG. 7 shows a first application of magnetostrictive layer 2 on a flexible beam 11 in a microvalve. The microvalve shown here is similar to the thermomechanical drive described in German Patent Application No. 40 03 619. The microvalve is made of three structured silicon plates 30, 31, 32. Flexible beam 11 and jet divider 37 are shaped from the middle silicon plate 31. Inlet 34 and outlet 35 are formed by the corresponding structures of upper silicon plate 30 and middle silicon plate 31. Outlet 36 is obtained by structuring, in a suitable manner, middle silicon plate 31 and lower silicon plate 32. The valve is surrounded by an external coil 33, which produces a magnetic field oriented parallel to flexible beam 11. Flexible beam 11 is shown here in its initial position, i.e., without an external magnetic field. Due to internal stresses between thin layer 2 and flexible beam 11, flexible beam 11 is bent slightly upward. A fluid jet entering through inlet 34 is thus directed by flexible beam 11 into outlet 35. When an external magnetic field is produced by coil 33, thin layer 2 expands. This results in the flexible beam bending to tile side on which there is no thin layer 2, i.e., in this case downward, as described in relation to FIG. 3. Since the fluid jet entering through inlet 34 adheres to the top of flexible beam 11, when flexible beam 11 is deflected downward, the fluid jet is directed against jet divider 37 so that it exits the valve through outlet 36. Thus the fluid jet can be arbitrarily directed back and forth between outlets 35 and 36 with the magnetic field produced by coil 33.

Coil 33 is designed as a regular air-core coil. It is especially advantageous in this valve construction that the magnetostrictive effect is particularly high due to the direction of the magnetic field as shown in FIG. 3. Furthermore, no electric lead-ins are required in the valve. Thus the construction of the valve is substantially simplified. The disadvantage of this arrangement is that valve and coil must be individually brought together.

Figure 8:
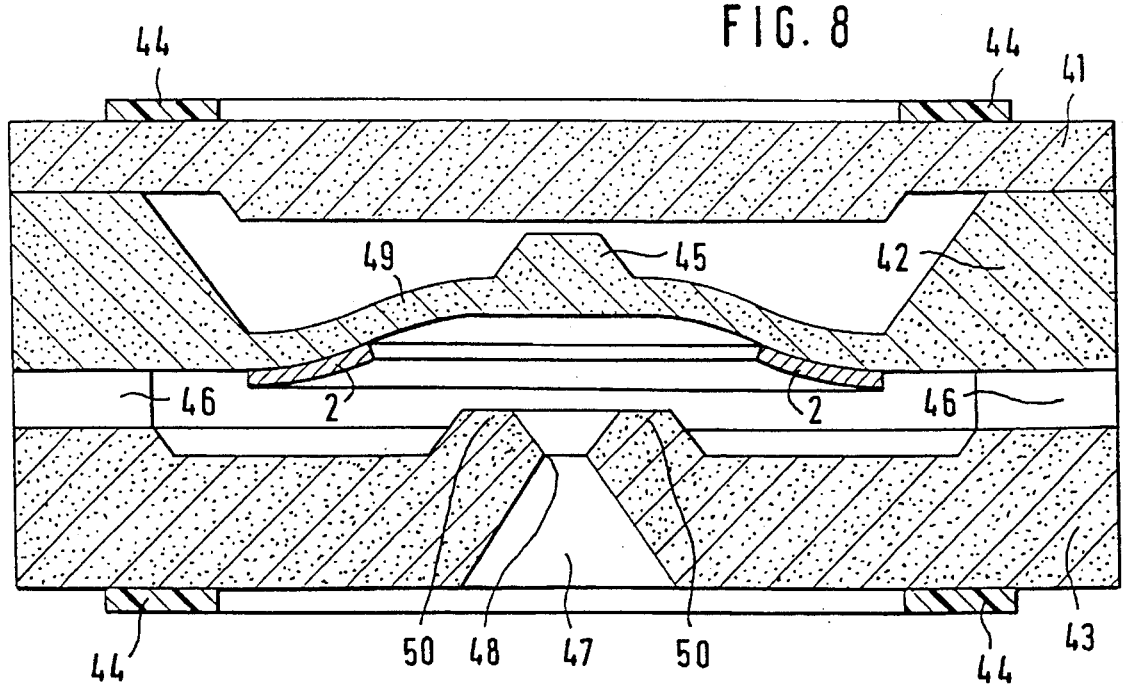
FIG. 8 shows a second example of an embodiment of a magnetostrictive valve according to the present invention.

FIG. 8 shows another embodiment of a microvalve, based to a considerable extent on the microvalve described in German Patent Application No. 39 19 876. The valve described therein assumed, however, a piezoelectric drive. A special advantage of the microvalve of FIG. 8 is that the entire valve can be manufactured simultaneously with a plurality of valves from a single substrate. In particular, it is not necessary to manufacture the valve body and the coil for producing the magnetic field separately and mount them together in a subsequent step. The valve is made of, for example, three silicon plates 41, 42, 43, with a membrane 49 and a sealing block 45 on the membrane formed from the middle silicon plate 42. This serves as a stop for limiting the cross section of the opening and results in improved sealing characteristics. Inlet 46 is formed from the corresponding structures of middle silicon plate 42 and lower silicon plate 43. Furthermore, lower silicon plate 43 has an opening, outlet 47, surrounded by a valve seat 50. Outlet 47 is structured via suitable etching processes so that it has a sharp edge, referred to as tear-off edge 48. On the top surface of silicon plate 41 and the bottom surface of silicon plate 43 there are printed circuits applied using thick-film technology for a thick-film coil 44. Alternatively the coil can be made using thin-film technology, in which case the thickness of the printed circuits can be increased using electrochemical processes. A thin magnetostrictive layer 2 is applied to membrane 49. Thick-film coil 44 produces a magnetic field, which is approximately perpendicular to the surface of thin layer 2. This magnetic field causes thin layer 2 to contract, as described previously in relation to FIG. 4, in the direction perpendicular to the magnetic field, i.e., parallel to the surface of membrane 49. Thus, membrane 49 is deflected to the side of thin layer 2, i.e., downward, in the direction of valve seat 50. This deflection of membrane 49 causes sealing block 45 to be pressed against valve seat 50. Thus outlet 47 is closed. The deformation of membrane 49 shown here occurs when there is a pressure difference between the hollow space formed by membrane 49 and the upper silicon plate 41 and inlet 46. In this case part of the force that can be produced by the thin layer must be used to overcome this pressure difference. In order to effectively convert the available force into motion, in an improved embodiment of this valve, membrane 49 has openings instead of sealing block 45 being suspended from a closed membrane 49. Furthermore, sealing block 45 can be suspended from individual flexible beams. Through these measures it is achieved that the pressure on both sides of the flexible element is almost the same and only a small pressure difference must be overcome.

In the arrangement shown in FIG. 8 of coil and thin layer 2 it is advantageous that coil 44 be applied to the top and bottom surfaces of the silicon plate bond using coating technology. Thick film coils are especially inexpensive and can be manufactured simultaneously on a plurality of valves. This is also true when the coils are manufactured by thin-film technology. As a disadvantage it must be noted that in FIG. 8 the magnetostrictive effect of thin layer 2 that is available for moving the flexible element is somewhat lower.

In the open position, high-frequency vibrations can be induced in membrane 49 and sealing block 45 by applying a suitable alternating magnetic field to thin film 2. When excitation occurs with the natural frequency of the system consisting of sealing block 45 and membrane 49, high vibration amplitudes are achieved even with moderate power. Using a suitable rigidity of membrane 49, this vibration may be located in the ultrasound range, thereby improving the atomization of a liquid exiting through outlet 47. In this case it is also advantageous that outlet 47 have a sharp tear-off edge 48. Atomization of the exiting liquid is especially advantageous when, for example, the valve is used for injecting gasoline in an engine. Furthermore, by inducing high-frequency vibrations, the hazard of contamination is reduced, since deposits on the inner surfaces of the valve body are largely prevented from forming. This is especially advantageous for preserving the operability of microvalves that can easily become contaminated.

What is claimed is:

1. A magnetostrictive transducer comprising:

means for producing a magnetic field; and a drive including a first thin layer of magnetostrictive material arranged on a flexible element in the magnetic field, the first thin layer being composed of $Tb_{(1-x)}Dy_{(x)}Fe_2$ ($0<x<1$) and being deposited from a metal vapor.

2. The magnetostrictive transducer according to claim 1, wherein the first thin layer is amorphous.

3. The magnetostrictive transducer according to claim 1, wherein the first thin layer is nanocrystalline with an average grain diameter of less than 50 nanometers.

4. The magnetostrictive transducer according to claim 1, wherein the first thin layer is structured.

5. The magnetostrictive transducer according to claim 4, wherein the first thin layer contains individual, electrically insulated areas.

6. The magnetostrictive transducer according to claim 1, wherein the flexible element is one of a flexible beam and a flexible membrane.

7. The magnetostrictive transducer according to claim 1, wherein the first thin layer is embedded in a second thin layer made of a soft magnetic material.

8. The magnetostrictive transducer according to claim 1, wherein the first thin layer includes a protective layer composed of one of $Si_3N_4$, TiN, NiCr and NiFe.

9. The magnetostrictive transducer according to claim 1, wherein the means for producing the magnetic field includes at least one of a thick-film coil and a thin-film coil.

10. The magnetostrictive transducer according to claim 1, further comprising a valve having at least one inlet opening and, and at least first and second outlet channels; and wherein the drive is arranged in parallel to a direction of flow of a fluid jet, and the magnetic field deflects the flexible element, such that the fluid jet enters the valve through the at least one inlet opening and is directed into one of the at least first and second outlet channels depending upon a position of the flexible element.

11. The magnetostrictive transducer according to claim 1, further comprising a valve having at least one inlet opening; at least one outlet opening; a sealing block suspended from the flexible element; and wherein the magnetic field deflects the flexible element, such that a deflection of the flexible element closes the outlet opening via the sealing block.

12. The magnetostrictive transducer according to claim 11, wherein when the outlet opening is open, vibrations are induced in the flexible element by the magnetic field at a natural frequency of the flexible element.

13. The magnetostrictive transducer according to claim 12, wherein a liquid medium is atomized by the vibrations of the flexible element.

14. The magnetostrictive transducer according to claim 11, wherein the valve is at least partially composed of silicon plates.

15. The magnetostrictive transducer according to claim 11, wherein the valve is at least partially composed of a metal substrate.

16. The magnetostrictive transducer according to claim 15, wherein the metal substrate is one of steel, nickel and titanium.

17. The magnetostrictive transducer according to claim 11, wherein the means for producing the magnetic field is arranged on an outside of the valve.

* * * * *